(12) United States Patent
Xu et al.

(10) Patent No.: US 12,695,294 B2
(45) Date of Patent: Jul. 28, 2026

(54) FAULT DETECTION CIRCUIT FOR SOLID-STATE MOTOR CONTROLLERS

(71) Applicant: ABB Schweiz AG, Baden (CH)

(72) Inventors: Chunmeng Xu, Raleigh, NC (US);
Dorai Yelaverthi, Raleigh, NC (US);
Pietro Cairoli, Cary, NC (US)

(73) Assignee: ABB Schweiz AG, Baden (CH)

( * ) Notice: Subject to any disclaimer, the term of this patent is extended or adjusted under 35 U.S.C. 154(b) by 308 days.

(21) Appl. No.: 18/435,677

(22) Filed: Feb. 7, 2024

(65) Prior Publication Data

US 2025/0253642 A1 Aug. 7, 2025

(51) Int. Cl.
*H02P 6/20* (2016.01)
*G01R 31/327* (2006.01)
(Continued)

(52) U.S. Cl.
CPC ........... *H02H 7/08* (2013.01); *G01R 31/3277* (2013.01)

(58) Field of Classification Search
CPC .. H02M 7/219; H02M 7/4835; H02M 1/0032; H02M 1/0064; H02M 1/007;
(Continued)

(56) References Cited

U.S. PATENT DOCUMENTS 6,222,355 B1 * 4/2001 Ohshima ............ H03K 17/0822
323/289
10,276,321 B2 4/2019 Kennedy et al.
(Continued)

FOREIGN PATENT DOCUMENTS

CN 108387830 A 8/2018
EP 3266031 B1 2/2016
(Continued)

OTHER PUBLICATIONS

Li et al., "A Review of Short Circuit Detection Sensor for SiC MOSFET," *9th International Forum on Electrical Engineering and Automation (IFEEA)*, 5 pp. (Nov. 4, 2022).
(Continued)

*Primary Examiner* — Kawing Chan
*Assistant Examiner* — Charles S Laughlin
(74) *Attorney, Agent, or Firm* — Fitch Even Tabin & Flannery LLP

(57) ABSTRACT

A method is provided for protecting a circuit comprising a switch device connected between a power source and a load, the power switch device controlled by a gate driver. The method comprises generating a first trip signal indicating a desaturation (DESAT) signal based on an input voltage to the gate driver and a first trip threshold; generating a second trip signal indicating an overcurrent detection (OCD) signal based on a current obtained by a current sensor and a second trip threshold; generating a third trip signal indicating a transient recompensed instantaneous trip (TRIP) signal based on the current obtained by the current sensor and a third trip threshold; detecting, using a microcontroller, a fault based on merging at least two of the first trip signal, the second trip signal, and the third trip signal; and controlling, based on detecting the fault, the gate driver to disconnect the switch device.

20 Claims, 10 Drawing Sheets

(51) Int. Cl.
H02H 7/08 (2006.01)
H02P 6/14 (2016.01)

(58) Field of Classification Search
CPC .. H02M 1/0074; H02M 1/0077; H02M 1/092;
H02M 1/4216; H02M 1/4225; H02M
3/04; H02M 3/1584; H02M 3/28; H02M
3/33507; H02M 3/338; H02M 3/3385;
H02M 5/225; H02M 7/04; H02M 7/44;
H02M 7/53862; H02P 29/0241; H02P
29/027; H02P 27/08; H02P 29/024; H02P
29/0243
See application file for complete search history.

(56) References Cited

U.S. PATENT DOCUMENTS

| | | | |
|---|---|---|---|
| 10,332,716 | B2 | 6/2019 | Hosko et al. |
| 10,630,069 | B2 | 4/2020 | Kennedy et al. |
| 10,644,622 | B2 | 5/2020 | Steinberger et al. |
| 10,770,887 | B2 | 9/2020 | Nojima |
| 11,239,649 | B2 | 2/2022 | Zhou et al. |
| 2015/0155700 | A1 | 6/2015 | Alvarez Valenzuela et al. |
| 2021/0099167 | A1* | 4/2021 | Kempitiya ........... H03K 17/042 |
| 2021/0336616 | A1* | 10/2021 | Charpentier ......... H03K 17/168 |
| 2022/0060184 | A1 | 2/2022 | Domes |
| 2023/0187922 | A1* | 6/2023 | Randazzo .............. H02H 5/048 |
| | | | 361/87 |

FOREIGN PATENT DOCUMENTS

| | | |
|---|---|---|
| WO | WO 2020/169753 A1 | 8/2020 |
| WO | WO 2022/171365 A1 | 8/2022 |

OTHER PUBLICATIONS

Wang et al., "Design and Performance Evaluation of Overcurrent Protection Schemes for Silicon Carbide (SiC) Power MOSFETs," *IEEE Transactions on Industrial Electronics*, 61(10): 5570-5581 (Oct. 1, 2014).
European Patent Office, Extended European Search Report in European Patent Application No. 25156179.1, 13 pp. (Jul. 2, 2025).

* cited by examiner

100

200

300

400

500

600

700

800

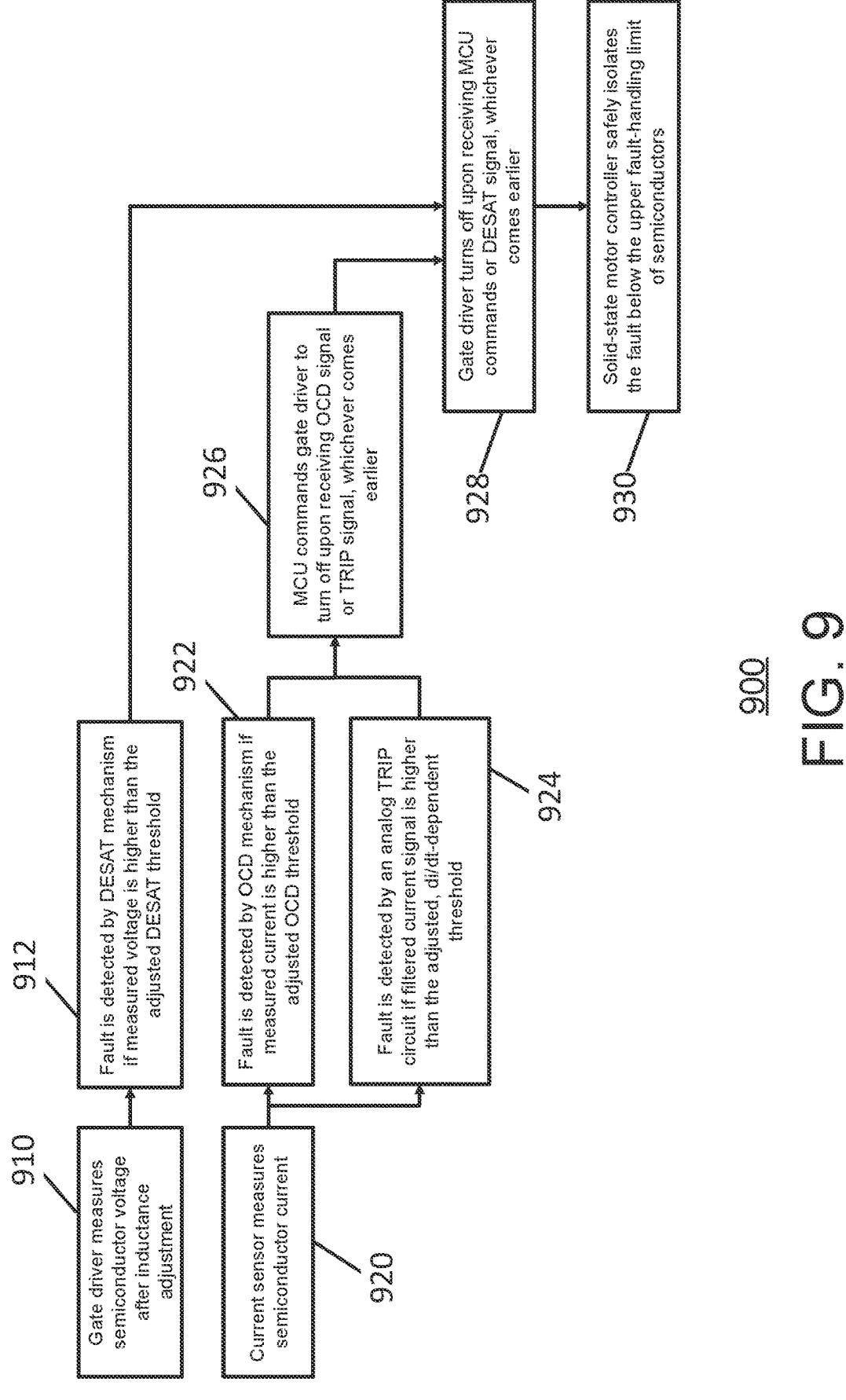

910 — Gate driver measures semiconductor voltage after inductance adjustment

912 — Fault is detected by DESAT mechanism if measured voltage is higher than the adjusted DESAT threshold 920 — Current sensor measures semiconductor current 922 — Fault is detected by OCD mechanism if measured current is higher than the adjusted OCD threshold 924 — Fault is detected by an analog TRIP circuit if filtered current signal is higher than the adjusted, di/dt-dependent threshold 926 — MCU commands gate driver to turn off upon receiving OCD signal or TRIP signal, whichever comes earlier 928 — Gate driver turns off upon receiving MCU commands or DESAT signal, whichever comes earlier 930 — Solid-state motor controller safely isolates the fault below the upper fault-handling limit of semiconductors

FAULT DETECTION CIRCUIT FOR SOLID-STATE MOTOR CONTROLLERS

FIELD

The present disclosure relates to a fault detection circuit designed to achieve fault protection for solid-state switching apparatus including circuit breakers, motor contactors, motor soft starters and for power distribution applications where solid-state circuit breakers and solid-state motor controllers are implemented.

BACKGROUND

A fault detection circuit is an electronic circuit designed to identify and indicate the presence of faults or abnormalities within a system. For instance, in a motor controller, a fault detection circuit is employed to detect and identify any abnormalities or faults that may occur during the operation of the motor.

To reduce the installation space and cabling effort, an all-in-one solid-state motor controller with fault protection functions has been studied recently, leveraging the latest wide bandgap semiconductor technology. The solid-state motor controller has silicon carbide (SIC) MOSFETs as the main power switches to actively make and break the circuits under normal operation commands. The solid-state motor controller can also turn off all its SiC MOSFETs at once to break fault currents under short-circuit trip commands.

However, one critical problem arises from generating the prompt and accurate trip commands under fault current conditions. It is not feasible to reuse the thermomagnetic or electromagnetic trip units of existing circuit breakers due to their inadequate response speed. An electronic trip unit uses sensors and microcontrollers to monitor signals and command operations, showcasing a higher speed.

However, the current motor controller trip units, including electronic trip units encounter diverse challenges, such as the fault detection time and the fault (current) interruption threshold. In view of the aforementioned challenges, there is a need to advance the development of more sophisticated fault detection mechanisms to enhance the protection of motor controllers.

SUMMARY

A first aspect of the present disclosure provides a method for protecting a circuit comprising a switch device connected between a power source and a load, the power switch device controlled by a gate driver. The method comprises: generating a first trip signal indicating a desaturation (DE-SAT) signal based on an input voltage to the gate driver and a first trip threshold; generating a second trip signal indicating an overcurrent detection (OCD) signal based on a current obtained by a current sensor and a second trip threshold; generating a third trip signal indicating a transient recompensed instantaneous trip (TRIP) signal based on the current obtained by the current sensor and a third trip threshold, wherein the third trip threshold is adjustable based on a rate of rise of the current obtained by the current sensor; detecting, using a microcontroller, a fault based on merging at least two of the first trip signal, the second trip signal, and the third trip signal; and controlling, based on detecting the fault, the gate driver to disconnect the switch device.

According to an implementation of the first aspect, the first trip threshold is adjusted through an inductor connected in series with the switch device.

According to an implementation of the first aspect, the method further comprises: generating, by the microcontroller, based on the second trip signal and the third trip signal, an output indicating a fault. Detecting the fault based on merging at least two of the first trip signal, the second trip signal, and the third trip signal further comprises: detecting the fault based on the first trip signal and the output of the microcontroller.

According to an implementation of the first aspect, detecting the fault based on merging at least two of the first trip signal, the second trip signal, and the third trip signal further comprises: detecting the fault based on receiving an earlier signal between the first trip signal and the output of the microcontroller; and generating the output of the microcontroller based on receiving an earlier signal between the second trip signal and the third trip signal.

According to an implementation of the first aspect, the current sensor is connected in series with the power switch device, or the current sensor is electromagnetically coupled to a current-conducting wire connected to the power switch device.

According to an implementation of the first aspect, the second trip threshold is adjustable by a voltage divider, and wherein the voltage divider comprises a fixed resistor and an adjustable resistor.

According to an implementation of the first aspect, the third trip threshold is determined based on a preset trip threshold and a threshold adjustment based on the rate of rise of the current obtained by the current sensor.

According to an implementation of the first aspect, generating the third trip signal indicating the TRIP signal based on the current obtained by the current sensor and the third trip threshold further comprises: generating a first current element by scaling the rate of rise of the current with a first ratio; generating a combined current based on combining the first current element and a second current element, wherein the second current element is obtained by scaling the current obtained by the current sensor with a second ratio; comparing the combined current with the third trip threshold; and generating the third trip signal based on the combined current being greater or equal to the third trip threshold.

According to an implementation of the first aspect, generating the third trip signal indicating the TRIP signal based on the current obtained by the current sensor and the third trip threshold is performed by a plurality of operational amplifiers (op-amps). The plurality of op-amps comprises a first op-amp as a differentiator, a second op-amp as an adder, and a third op-amp as a comparator.

According to an implementation of the first aspect, generating the third trip signal indicating the TRIP signal based on the current obtained by the current sensor and the third trip threshold is performed by a plurality of operational amplifiers (op-amps). The plurality of op-amps comprises a first op-amp as a low-pass filter, a second op-amp as a differentiator, a third op-amp as a subtractor, and a fourth op-amp as a comparator.

According to an implementation of the first aspect, the power switch device comprises one or more metal-oxide-semiconductor field-effect transistors (MOSFETs), insulated gate bipolar transistors (IGBTs), bipolar transistors, high-electron-mobility transistors, junction field-effect transistors, bipolar junction transistors, fin field-effect transistors, or gate injection transistors.

A second aspect of the present disclosure provides a device for circuit protection. The device comprises: one or more switches connected between a power source and a load; one or more gate drivers connected to the one or more switches and configured to disconnect the one or more switches based on detecting a fault, wherein the one or more gate drivers are configured to generate the first trip signal indicating a desaturation (DESAT) signal based on an input voltage to the one or more gate drivers and a first trip threshold; a current sensor connected to a circuit path to obtain a current flowing through the one or more switches, wherein the current sensor is configured to generate a second trip signal indicating an overcurrent detection (OCD) signal based on the current obtained by the current sensor and a second trip threshold; an analog circuit comprising a plurality of operational amplifiers (op-amps), the analog circuit connected between the current sensor and a microcontroller, wherein the analog circuit is configured to generate a third trip signal indicating a transient recompensed instantaneous trip (TRIP) signal based on the current obtained by the current sensor and a third trip threshold adjusted by a rate of change of the current obtained by the current sensor; and the microcontroller connected to the current sensor, an output end of the analog circuit, and the one or more gate drivers, wherein the microcontroller is configured to generate an output indicating a fault based on the second trip signal and the third trip signal. Detecting the fault is based on the first trip signal and the output of the microcontroller.

According to an implementation of the second aspect, the device further comprises: one or more inductors connected in series with the one or more switches, wherein the first trip threshold is adjusted through the one or more inductors.

According to an implementation of the second aspect, detecting the fault is based on receiving an earlier signal between the first trip signal and the output of the microcontroller. The microcontroller is configured to generate the output of the microcontroller based on receiving an earlier signal between the second trip signal and the third trip signal.

According to an implementation of the second aspect, the current sensor is connected in series with the one or more switches, or the current sensor is electromagnetically coupled to a current-conducting wire connected to the one or more switches.

According to an implementation of the second aspect, the device further comprises: a voltage divider connected to the current sensor. The voltage divider comprises a fixed resistor and an adjustable resistor. The second trip threshold is adjustable by the voltage divider.

According to an implementation of the second aspect, the analog circuit comprising the plurality of op-amps is configured to: generate a first current element by scaling the rate of rise of the current with a first ratio; generating a combined current based on combining the first current element and a second current element, wherein the second current element is obtained by scaling the current obtained by the current sensor with a second ratio; comparing the combined current with the third trip threshold; and generating the third trip signal based on the combined current being greater or equal to the third trip threshold.

According to an implementation of the second aspect, the plurality of op-amps comprises a first op-amp as a differentiator, a second op-amp as an adder, and a third op-amp as a comparator, or the plurality of op-amps comprises a first op-amp as a low-pass filter, a second op-amp as a differentiator, a third op-amp as a subtractor, and a fourth op-amp as a comparator.

According to an implementation of the second aspect, a Zener diode connected between the output of a gate driver of the one or more gate drivers and the current sensor.

A third aspect of the present disclosure provides a device for circuit protection. The device comprises: one or more switches connected between a power source and a load; one or more gate drivers connected to the one or more switches and configured to disconnect the one or more switches based on detecting a fault, wherein the one or more gate drivers are configured to generate the first trip signal indicating a desaturation (DESAT) signal based on an input voltage to the one or more gate drivers and a first trip threshold; a current sensor connected to a circuit path to obtain a current flowing through the one or more switches, wherein the current sensor is configured to generate a second trip signal indicating an overcurrent detection (OCD) signal based on the current obtained by the current sensor and a second trip threshold; an analog circuit comprising a plurality of operational amplifiers (op-amps), the analog circuit connected between the current sensor and one or more logic gates, wherein the analog circuit is configured to generate a third trip signal indicating a transient recompensed instantaneous trip (TRIP) signal based on the current obtained by the current sensor and a third trip threshold adjusted by a rate of change of the current obtained by the current sensor; and the one or more logic gates connected to the current sensor, an output end of the analog circuit, and the one or more gate drivers, wherein the one or more logic gates are configured to generate an output indicating a fault based on the second trip signal and the third trip signal. Detecting the fault is based on the first trip signal and the output of the one or more logic gates.

BRIEF DESCRIPTION OF THE DRAWINGS

Embodiments of the present disclosure will be described in even greater detail below based on the exemplary figures. The present disclosure is not limited to the exemplary embodiments. All features described and/or illustrated herein can be used alone or combined in different combinations in embodiments of the present disclosure. The features and advantages of various embodiments of the present disclosure will become apparent by reading the following detailed description with reference to the attached drawings which illustrate the following:

FIG. 9 is a flowchart of protecting a solid-state motor controller according to one or more embodiments of the present disclosure.

DETAILED DESCRIPTION

Figure 1:
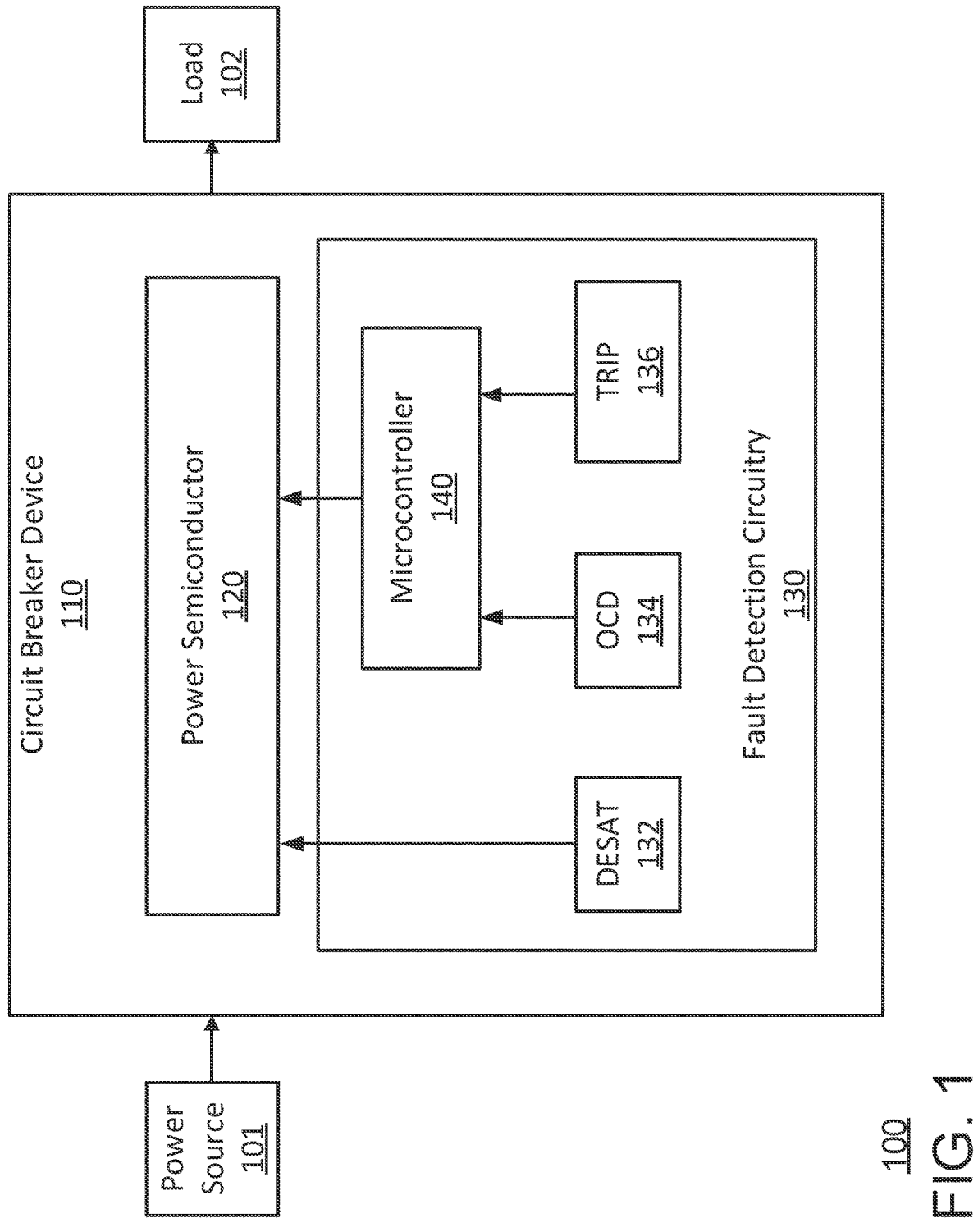
FIG. 1 is a block diagram depicting an exemplary system with fault protection according to one or more embodiments of the present disclosure.

The present application provides a fault detection scheme for enhanced circuit protection. Fault detection circuits/devices that utilize this scheme may be incorporated into solid-state motor controllers, either integrated within them or connected to the controllers. The fault detection scheme combines three protection (or trip) mechanisms, addressing various fault stages. The various fault stages correspond to different ranges of the rate of rise in fault current (di/dt). During low di/dt faults, indicative of slower-developing fault currents, an overcurrent detection (OCD) signal from one or more current sensors is employed to trip the circuit. During medium di/dt faults, indicative of moderately developing fault currents, a desaturation (DESAT) signal from one or more semiconductor gate drivers is employed to trip the circuit. During high di/dt faults, indicative of fast-developing fault currents, an analog Transient Recompensed Instantaneous Trip (TRIP) signal is employed to trip the circuit. The TRIP signal compensates for the di/dt effect of the fault and clamps the expected trip current around the upper limit, effectively managing the most severe and rapidly developing faults with high di/dt values. This approach ensures that the overall combined trip current, spanning all ranges of fault currents, is well controlled and maintained below the upper limit of the motor's inrush withstand capability.

Furthermore, fault detection circuits may utilize one or more inductors with small inductance to adjust the trip threshold for generating the DESAT signal. For example, the one or more inductors may be connected in series with power semiconductors (e.g., power switches) to adaptively decrease the DESAT threshold when the fault di/dt increases.

The fault detection scheme of the present disclosure may solve the existing problem that the trip current goes higher with a faster-developing faults (higher di/dt values) given the same trip threshold settings in solid-state motor controllers. With the fault detection scheme provided in the present disclosure, the fault current may be interrupted at a stable value and the protected system will not suffer unexpectedly high overcurrent damages.

In particular, exemplary aspects of fault detection circuits performing fault detection and interruption, according to the present disclosure, are further elucidated below in connection with exemplary embodiments, as depicted in the figures. The exemplary embodiments illustrate some implementations of the present disclosure and are not intended to limit the scope of the present disclosure.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description;

however, the description is not limited to the examples and/or implementations provided in the drawings.

Where possible, any terms expressed in the singular form herein are meant to also include the plural form and vice versa, unless explicitly stated otherwise. Also, as used herein, the term "a" and/or "an" shall mean "one or more" even though the phrase "one or more" is also used herein. Furthermore, when it is said herein that something is "based on" something else, it may be based on one or more other things as well. In other words, unless expressly indicated otherwise, as used herein "based on" means "based at least in part on" or "based at least partially on".

FIG. 1 is a block diagram depicting an exemplary system with fault protection according to one or more embodiments of the present disclosure. In particular, the system 100 includes a circuit breaker device 110 (e.g., a solid-state circuit breaker (SSCB)) that controls the power distributed from a power source 101 to a load 102 and is configured to interrupt the circuit (e.g., make or break a respective circuit path) in response to a fault detection.

The power source 101 in the system 100 provides energy to the device 110 and the load 102. For instance, the power source 101 may be configured to provide energy (e.g., power, current, and/or voltage such as DC/AC power, DC/AC current, and/or DC/AC voltage) to the device 110 and the load 102. As shown, the device 110 is a device connected between the power source 101 and the load 102. In other instances, the device 110 may be included within the power source 101 and/or the load 102. For example, the power source 101 may include the device 110, and/or the load 102 may include the device 110. Alternatively, the device 110 may be included in a device/system having the power source 101 and the load 102.

The device 110 may be any type of control device that includes a power semiconductor 120 and a fault detection circuitry 130. For instance, the device 110 may be a motor controller, such as a solid-state motor controller, configured to control the operation of a motor system. The device 110 may include additional elements that are not shown in FIG. 1, including discrete active and passive electrical components and/or integrated circuits/modules.

The power semiconductor 120 may include a switch device for the load 102. The switch device may include semiconductor devices, including but not limited to Insulated Gate Bipolar Transistors (IGBTs), Metal-Oxide-Semiconductor Field-Effect Transistors (MOSFETs), bipolar transistors, high-electron-mobility transistors, junction field-effect transistors, bipolar junction transistors, fin field-effect transistors, and gate injection transistors.

The power semiconductor 120 may be controlled by a driver device/unit. For example, the power semiconductor 120 may include semiconductor transistors, controlled by one or more gate drivers. A gate driver is connected to a corresponding transistor and configured to send signals to the gate of the transistor to switch the transistor between connected and disconnected states. There may be one or more other active or passive components between the power semiconductor 120 and the power source 101, such as resistors, capacitors, inductors, power amplifiers, etc. In some instances, the power semiconductor 120 and/or the corresponding gate driver(s) may be included in the fault detection circuitry 130.

The power source 101 may be configured to provide alternating current (AC) or direct current (DC) power. The power semiconductor 120 may be used to control the connectivity or disconnection of the circuit path in which the load 102 is situated.

The load 102 may be any type of load that is connected to the power semiconductor 120. For instance, the load 102 may be a motor system, or a motor unit/module in a motor system. For example, the device 110 may be a motor controller with a circuit breaker(s), and the load may include motors in a motor system to be protected.

The fault protection circuitry 130 is configured to send appropriate signals to control the operation of the power semiconductor 120. For example, in the event of detecting/identifying a fault, the fault protection circuitry 130 may send a specific signal to shut off the power semiconductor 120, thereby protecting the system 100 (e.g., the device 110 and/or the load 102).

In some variations, the OCD 134, TRIP 136, and microcontroller 140 may be generated using software, for example, using Electronic Design Automation (EDA) tools or specialized software for circuit design. To this end, the software may execute hardware-like tasks of OCD 134, TRIP 136, and microcontroller 140. In some examples, a controller (e.g., a microprocessor) may define some or all of the functions within the OCD 134, TRIP 136, and microcontroller 140 through software. The controller may include a gigahertz-level microprocessor.

In power electronics and electrical circuits, di/dt fault refers to a fault condition related to the rate of change (or rise) of current over time. The term "di/dt" represents the derivative of current (i) with respect to time (1), indicating how rapidly the current is changing. A di/dt fault may occur when there is a sudden or rapid change in current within a circuit. This rapid change can lead to undesirable effects, such as voltage spikes, electromagnetic interference, or stress on components. These effects can potentially damage the components or disrupt the normal operation of the circuit. A fault protection circuit, such as the fault detection circuit 130, utilizes various protection mechanisms to mitigate the di/dt issues, including current sensor OCD (overcurrent detection) protection, gate driver desaturation (DESAT) protection, and an analog op-amp (operational amplifier) circuit issuing TRIP (Transient Recompensed Instantaneous trip (TRIP)) signal. The combination of three protection mechanisms enables fast response to a wide range of fault currents whose rate of rise goes above hundreds of amperes per microsecond.

As shown in FIG. 1, the fault detection circuit circuitry 130 includes three sections to realize the respective protection mechanisms, including a DESAT section 132, an OCD section 134, and a TRIP section. These sections in the fault detection circuitry 130 may generate various types of trip signals to control the operation of the circuit breaker device 110 (e.g., the power semiconductor 120). A trip signal refers to a signal that causes a circuit breaker to trip, opening its contacts to disconnect the faulty part of the system from the rest of the network. This action helps to protect the system from damage and ensures the safety and reliability of the power supply.

The DESAT section 132 includes suitable electrical/electronic components and/or circuitry to monitor a DESAT condition when the gate-source voltage of a power semiconductor device (e.g., the power semiconductor 120) falls below a predetermined threshold. Based on detecting the DESAT condition, the DESAT section 134 provides a DESAT signal. In some examples, a current (e.g., a DESAT current) associated with the DESAT condition may be calculated based on the gate-source voltage of the power semiconductor device.

The OCD section 134 includes suitable electrical/electronic components and/or circuitry to monitor current in a specific circuit path. For instance, the OCD section may utilize one or more current sensors to monitor current in the circuit path. The OCD section 132 provides an OCD signal based on an OCD condition, when the current exceeds a predetermined threshold. The one or more current sensors may take various forms and be connected in various suitable ways. In one example, a direct contact current sensor, such as a Hall effect sensor, may be connected in series with a power switch device (e.g., the power semiconductor 120) to sense the current in the circuit path. In another example, a current sensor, like a Rogowski coil or a current transformer, may be electromagnetically coupled to a current-conducting wire without a direct connection to sense the current.

The TRIP section 136 may include an analog op-amp circuit that includes suitable electrical/electronic components and/or circuitry to provide a TRIP signal in response to the most severe and fast-developing faults with high di/dt values. The TRIP signal issued by the analog op-amp circuit may compensate the fault di/dt effect and clamps the expected trip current around the upper limit.

Referring back to FIG. 1, a microcontroller 140, in the fault protection circuit 130, processes the OCD signal from the OCD section 134 and/or the TRIP signal from the TRIP circuit 136 to generate a command. The microcontroller 140 sends the command to the power semiconductor 120 to control the operation of the power semiconductor 120. For example, the command may cause one or more gate drivers to generate appropriate gate signals to control the connection of the semiconductor transistors in the power semiconductor 120.

Figure 2:
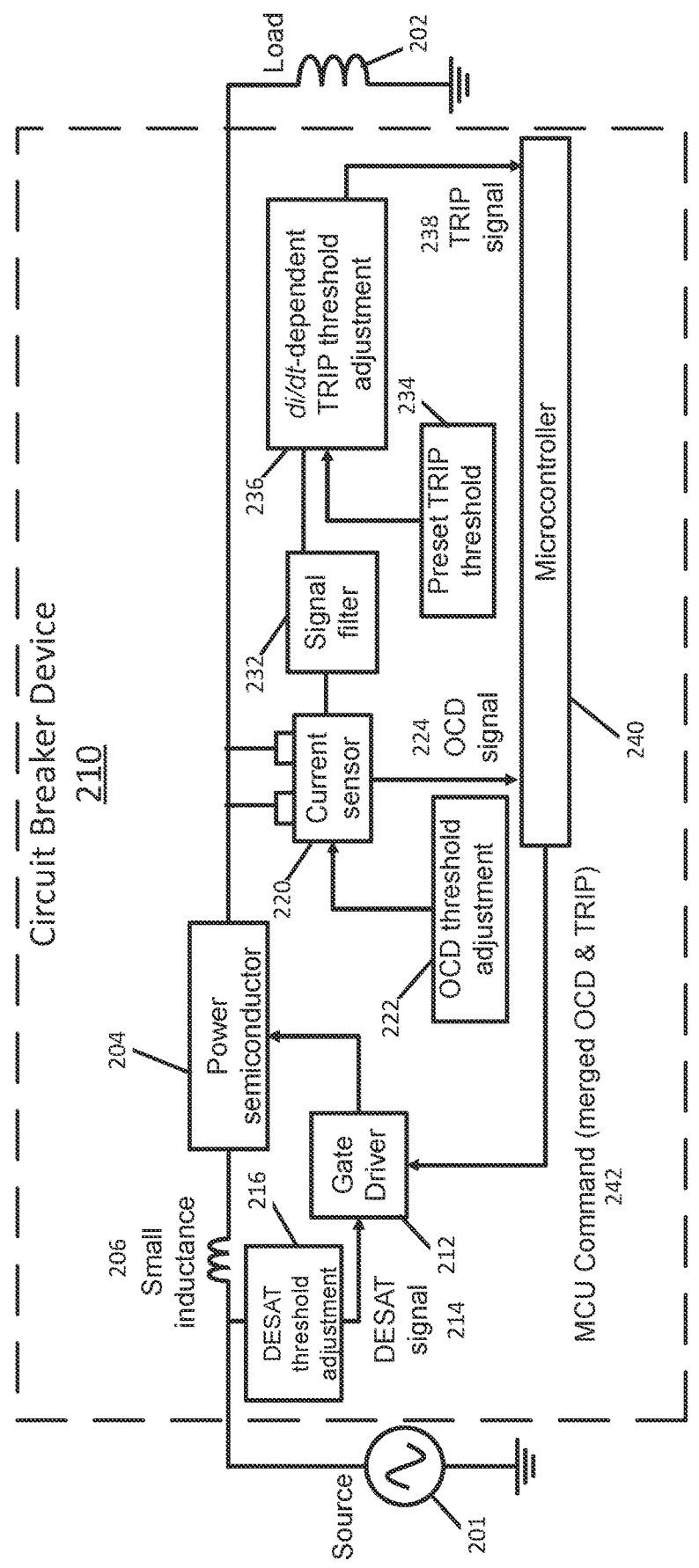
FIG. 2 is a diagram illustrating an exemplary fault protection circuit according to one or more embodiments of the present disclosure.

FIG. 2 is a diagram illustrating an exemplary fault protection circuit according to one or more embodiments of the present disclosure. The fault protection circuit 200 may be an example of the system 100 with fault protection as shown in FIG. 1. The fault protection circuit 200 may be implemented in a solid-state motor controller to facilitate various fault protection mechanisms. As shown in FIG. 2, in the fault protection circuit 200, a circuit breaker device 210 is powered by a source 201 and connected to a load 202. The circuit breaker device 210 may be an example of the circuit breaker device 110 as shown in FIG. 1. The circuit breaker device 210 includes a gate driver 212 that is configured to control the operation state of a power semiconductor 204. For example, the gate driver 212 and the power semiconductor 204 may be included in the power semiconductor 120 as shown in FIG. 1. Alternatively, the gate driver 212 may be included in the fault detection circuitry 130 in FIG. 1.

The circuit breaker device 210 protects the circuit 200 by utilizing current sensor OCD protection, gate driver DESAT protection, and a circuit (e.g., an analog op-amp circuit) issuing TRIP (e.g., a type of protection mechanism) signal.

The gate driver DESAT protection is achieved by a DESAT signal 214 generated by comparing a gate voltage to a DESAT threshold. The DESAT signal 214 may be an example of the DESAT signal 132 as shown in FIG. 1. For example, the circuit breaker device 210 includes a DESAT threshold adjustment module 216 configured to provide a voltage reference serving as the DESAT threshold. For instance, the DESAT signal 214 may be generated when the voltage input to the gate driver exceeds the reference voltage provided by the DESAT threshold adjustment module 216.

In some instances, the circuit breaker device 210 includes one or more inductor 206 with a small inductance (e.g., in the magnitude of 1 micro-Henry (μH)). The one or more inductors 206 may be connected in series to the power semiconductor 204. For example, an inductor 206 may be connected between the source 201 and the power semiconductor 204, and/or one inductor 206 may be connected between the load 202 and the power semiconductor 204. The inductor(s) 206 may be incorporated to achieve dynamic adjustment of the trip threshold for the DESAT signal generated in the circuit breaker device 210.

The current sensor OCD protection is achieved by an OCD signal 224 generated by comparing a current to an OCD threshold. The OCD signal 224 may be an example of the OCD signal 134 as shown in FIG. 1. For example, the circuit breaker device 210 includes a current sensor 220 configured to sense the current in the circuit and an OCD threshold adjustment module 222 configured to provide a current reference serving as the OCD threshold. For instance, the OCD signal 224 may be generated when the current sensed by the current sensor 220 exceeds the reference current provided by the OCD threshold adjustment module 222.

The current sensor 220 may take various forms and be connected in various suitable ways. For example, a direct contact current sensor, such as a Hall effect sensor, may be connected in series with the power semiconductor 204 to sense the current in the circuit path. Alternatively, a current sensor, like a Rogowski coil or a current transformer, may be electromagnetically coupled to a current-conducting wire without a direct connection to sense the current therein.

A circuit section is connected between the current sensor 220 and the microcontroller 240 and configured to generate a TRIP signal 238. The TRIP signal 238 may be an example of the TRIP signal 136 as shown in FIG. 1. The TRIP signal 238 is generated by comparing a di/dt-compensated current to a TRIP threshold. The circuit section in the circuit breaker device 210 may include various components to process the current sensed by the current sensor 220. For example, the circuit section includes a signal filter 232 that filters the signal (e.g., a current signal) from the current sensor 220, a module 234 providing a preset TRIP threshold, a module 236 providing a di/dt-dependent TRIP threshold adjustment. The circuit section is configured to generate the TRIP signal 238 based on determining that the filtered signal is higher than the adjusted di/dt-dependent threshold.

As shown in FIG. 2, the fault detection circuit 200 further includes a microcontroller 240 (e.g., similar to the microcontroller 140 in FIG. 1), which processes the OCD signal 224 and/or the TRIP signal 238 to generate a command, such as a microcontroller unit (MCU) command 242, and send the command to the gate driver 212. In one example, the microcontroller 240 may generate a MCU command by merging the OCD signal 224 and the TRIP signal 238. In another example, the microcontroller 240 may send the MCU command 242 based on receiving at least one of the OCD signal 224 or the TRIP signal 238. In yet another example, the microcontroller 240 may send the MCU command 242 based on receiving both the OCD signal 224 and the TRIP signal 238. The MCU command 242 may instruct the gate driver 212 to send a signal to disconnect the power semiconductor 204.

Figure 3A:
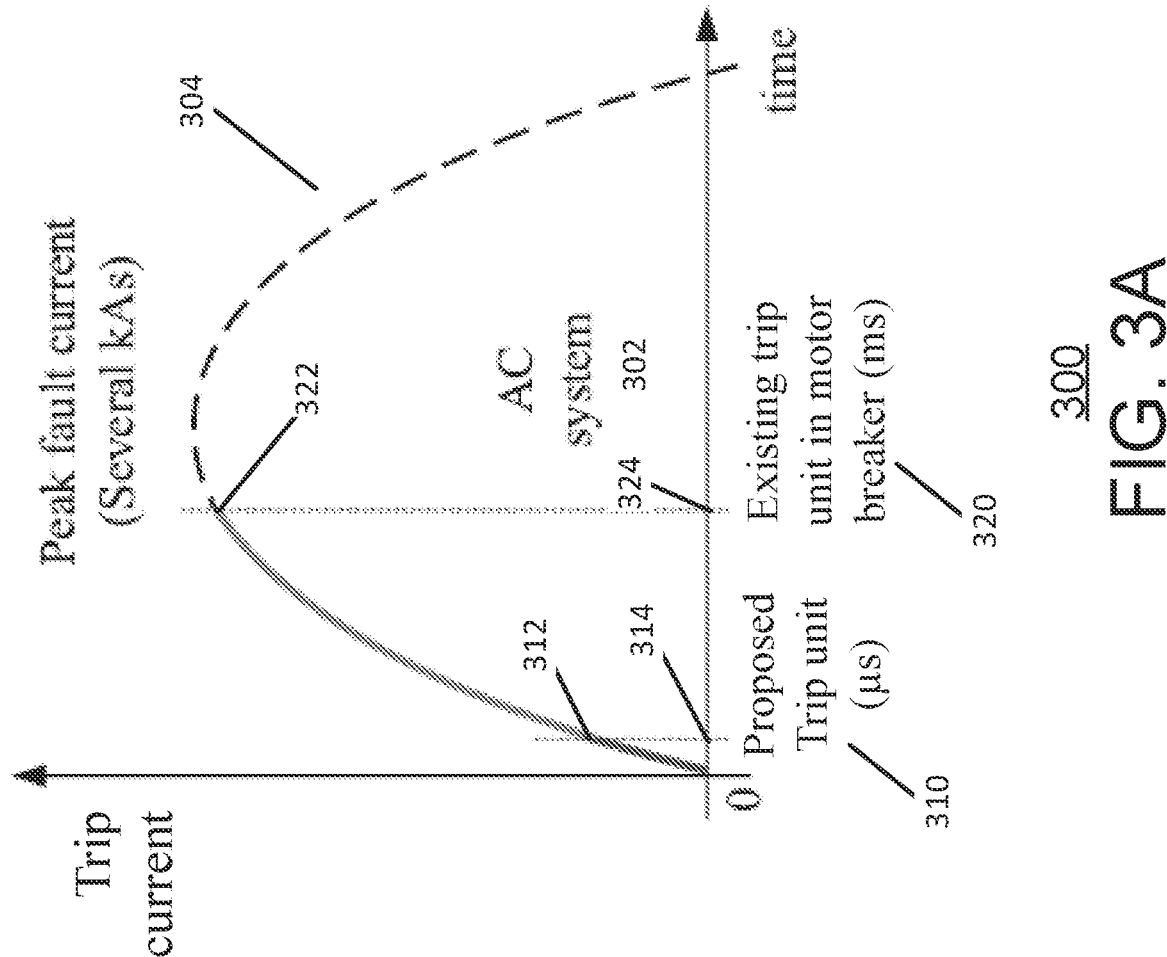
FIG. 3A is a graph illustrating performance of trip units according to one or more embodiments of the present disclosure.

FIG. 3A is a graph illustrating performance of trip units according to one or more embodiments of the present disclosure. The graph 300 shows the relationship between trip current and response time for various trip units, used as a metric to evaluate the performance of the trip units.

In FIG. 3A, the curve 304 represents the theoretical curve of AC current that an AC system 302 may experience without interruption. The peak fault current may reach several kilo amperes (kAs). Trip units may be incorporated in the AC system 302 to interrupt the AC system 302 before it reaches the peak fault current.

Existing trip units (e.g., thermomagnetic or electromagnetic trip units) in motor breakers (referred to as 320 in FIG. 3A) are typically capable of tripping the breaker in several milliseconds (ms). As shown in FIG. 3A, the existing trip unit 320 may detect the fault at time 324 and generate a corresponding trip current of 322. This response speed may not be ideal for certain applications, where the trip current may rise rapidly and nearly approaching a peak fault current when the trip unit responds.

The present disclosure employs trip units (referred to as 310 in FIG. 3A) that may detect the fault at the microsecond (μs) range (e.g., indicated by 314) thereby generating trip signals at a much smaller trip current (e.g., indicated by 312).

In this way, the devices provided in the present disclosure may address a previously discussed problem of generating prompt and accurate trip commands under fault current conditions. In some examples, silicon carbide (SiC) metal-oxide-semiconductor field-effect transistors (MOSFETs) may be implemented in a trip unit provided in the present disclosure. The SiC MOSFETs take several microseconds (μs) to interrupt an overcurrent, enabling μs-level fault detection time in the trip unit.

Figure 3B:
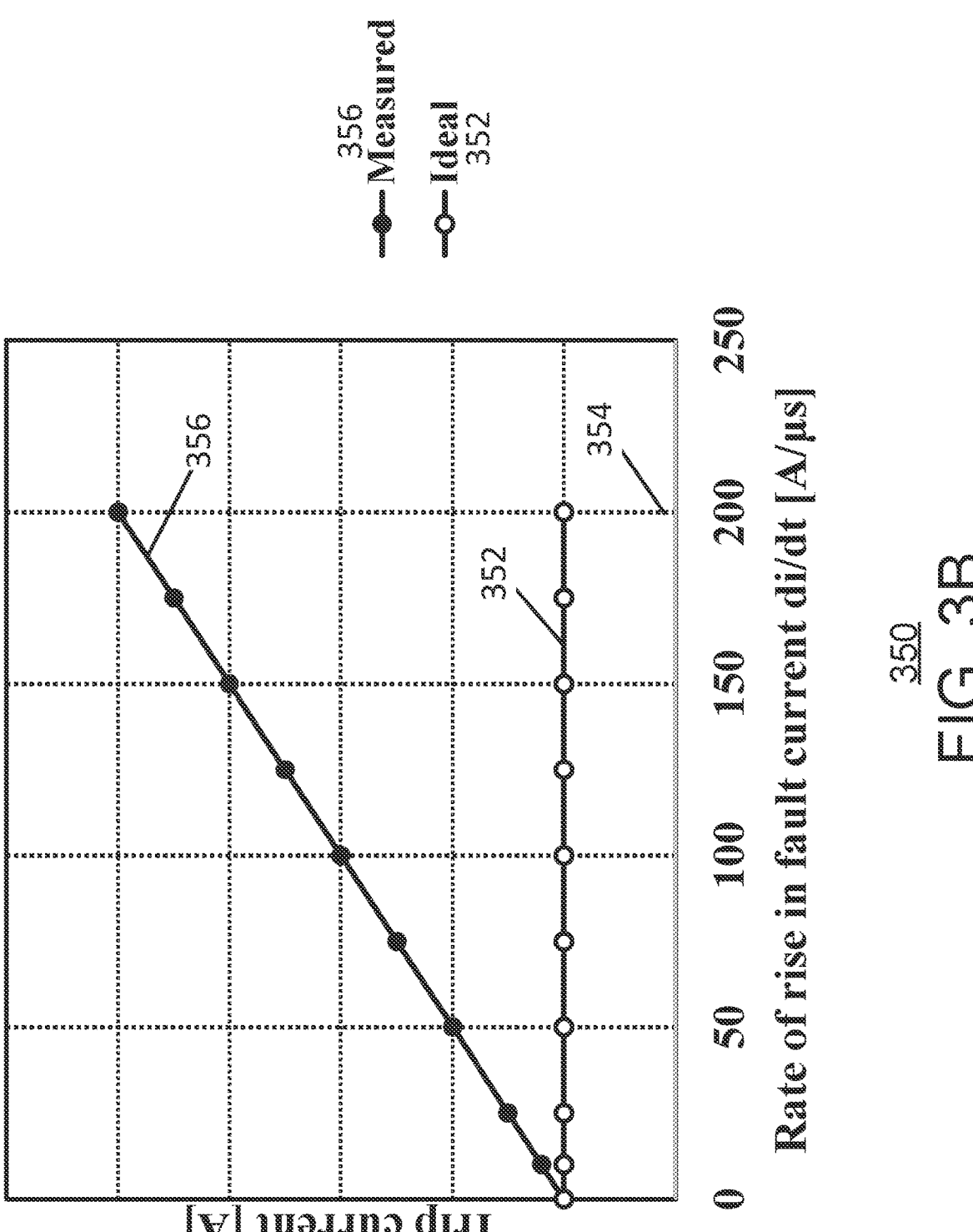
FIG. 3B is a graph showing the relationship between the trip current threshold and the rate of rise in fault current (di/dt)

As discussed earlier, another problem on the motor controller trip unit is about the fault current interruption threshold. FIG. 3B is a graph showing the relationship between the trip current threshold and the rate of rise in fault current (di/dt). As indicated by the ideal curve 352, it is intuitive to maintain a consistent trip current threshold below a motor inrush limit (e.g. indicated by a vertical dashed line 354), regardless of whether the fault current rises fast or slow. However, as indicated by the measured curve 356, the actual interruption current (e.g., the trip current) changes at different fault current conditions (e.g., as the value of di/dt changes). While testing fault current interruptions with a prototype, the maximum trip current was measured 308 A when the trip threshold was set at 260 A, meaning an uncontrolled 18% increase in the actual trip current.

As discussed earlier, there is a tendency of increasing current peaks at higher di/dt faults, which is caused by the delay time $$(t_{delay})$$

between the fault detection time moment ($t_{detect}$) and the fault interruption time moment $$(t_{trip}):$$

$$t_{delay} = t_{trip} - t_{detect}. \qquad \text{(Eq. 1)}$$

Affected by $$(t_{delay}),$$

the actual trip current $(I_{trip})$ is much higher than the threshold $(I_{th})$ when fault di/dt value is non-negligible:

$$I_{trip} = I_{th} + t_{delay} \times \frac{di}{dt}. \qquad \text{(Eq. 2)}$$

As indicated by Equation 2, the trip current $(I_{trip})$ increases linearly with di/dt (e.g., as shown in FIG. 3B).

The present disclosure provides the fault protection scheme to address the above-discussed problems. For example, to tackle the problem of ultra-short fault detection time, a fault protection circuit provided in the present disclosure may electronically measure a switch voltage (e.g., the voltage corresponding to the power semiconductor) and a load current, and then process the signals for fault detections in three independent detection mechanisms.

Figure 4:
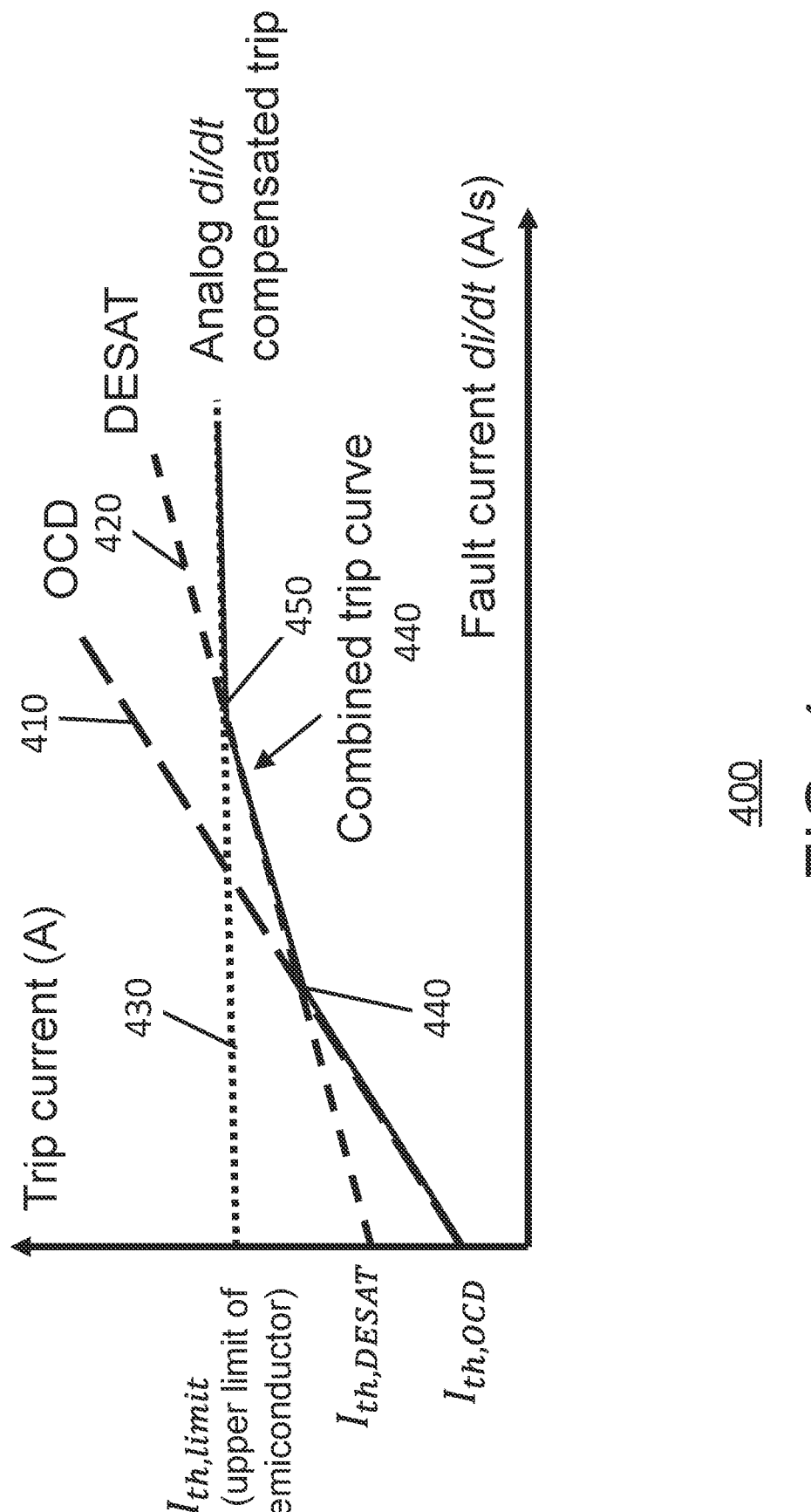
FIG. 4 is a graph illustrating the protective effects at different ranges of di/dt achieved by the three detection mechanisms.

FIG. 4 is a graph illustrating the protective effects at different ranges of di/dt achieved by the three detection mechanisms. In the graph 400, each protection mechanism is represented by a corresponding dashed line, depicting the trip current (in Amperes) versus the fault current (di/dt, in Amperes per second). The dashed lines 410, 420, 430 correspond to OCD, DESAT, and analog di/dt compensated trip, respectively. As depicted in FIG. 4, the dashed lines 410 and 420 intersect at point 440, and the dashed lines 420 and 430 intersect at point 450.

As shown in FIG. 4, the OCD signal (e.g., from current sensors) detects the fault at lower di/dt faults, for example, before the fault current (di/dt) reaches the intersection point 440, indicating a slower developing fault current. In this way, the OCD signal trips the circuit far below an upper protection limit. The upper protection limit (e.g., the upper limit of semiconductor) may be approximated by the dashed line 430. At medium di/dt faults (indicating a moderately developing fault current), the DESAT signal (e.g., from semiconductor gate drivers) detects faster than the OCD mechanism and then trips the circuit lower than the upper protection limit. Up to the most severe and fast-developing faults with high di/dt values, the Transient Recompensed Instantaneous Trip (TRIP) signal issued by an analog op-amp circuit (corresponding to the dashed line 430) compensates the fault di/dt effect and clamps the expected trip current around the upper limit. As indicated by the combined trip curve 440 (in solid line), the overall combined trip current across all ranges of fault currents is thus well controlled below the upper protection limit (e.g., the upper limit of the motor inrush withstand capability).

Figure 5:
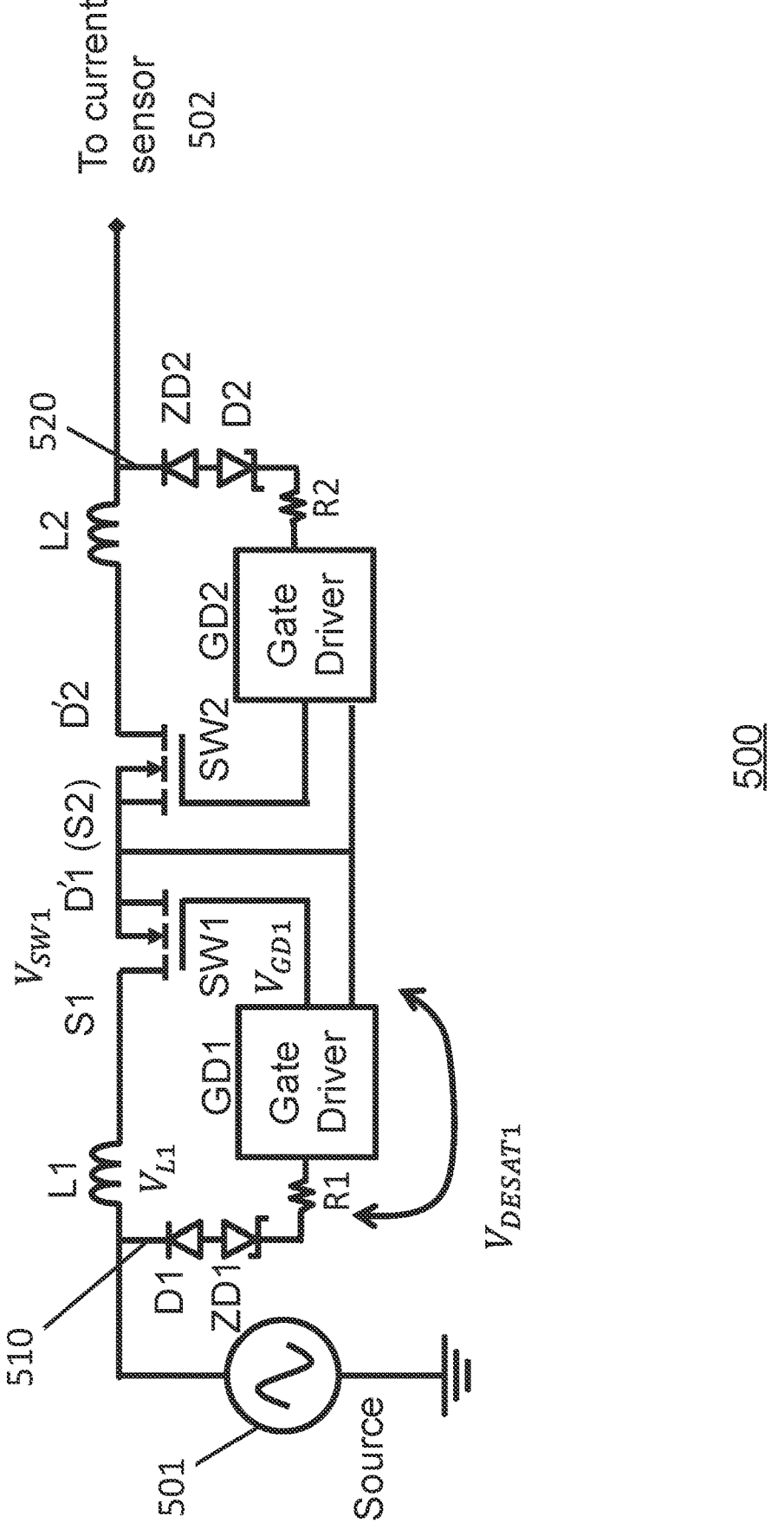
FIG. 5 is a schematic circuit illustrating an exemplary desaturation (DESAT) detection section according to one or more embodiments of the present disclosure.

FIG. 5 is a schematic circuit illustrating an exemplary DESAT detection section according to one or more embodiments of the present disclosure. The DESAT detection section 500 may be incorporated in any of the devices/circuits according to various embodiments of the present disclosure. The DESAT detection section 500 may be employed to generate the DESAT signal 132 as shown in FIG. 1 or the DESAT signal 214 as shown in FIG. 2.

As shown in FIG. 5, the circuit includes a first power switch (SW1) and a second power switch (SW2) that are connected in series. Each switch includes a source end (denoted as S), a drain end (denoted as D') and a gate end (denoted as G). As shown in FIG. 5, the source end (S1) of the first switch (SW1) is connected to a power source 501 in series with an inductor (L1). The drain end (D'1) of the first switch (SW1) is connected to the source end (S2) of the second switch (SW2). The drain end (D'2) of the second switch (SW2) is connected to a current sensor 502 in series with an inductor (L2). The current sensor 502 is connected in series in the circuit path between the switches (SW1 and SW2) and a load (not shown in FIG. 5). The gate end of the first switch (SW1) is connected to a first gate driver (GD1), and the gate end of the second switch (SW2) is connected to a second gate driver (GD). The drain end (D'1) of the first switch (SW1) and the source end (S2) of the second switch (SW2) are both connected to the first gate driver (GD1) and connected to the second gate driver (GD2).

The power switch (SW1, SW2)) and/or the gate drivers (GD1, GD2) may be included in a power semiconductor, such as the power semiconductor 120 in FIG. 1 or the power semiconductor 204 in FIG. 2. The inductors (L1, L2) may be examples of the inductor 206 in FIG. 2.

One end of a path 510 is connected between the source 501 and one end of the inductor (L1). The other end of the path 510 is connected to one end (also referred to as the DESAT terminal) of the first gate driver (GD1). In the path 510, a diode (D1) and a Zener diode (ZD1) are connected back-to-back. Other components, such as a resistor (R1), may be connected in series with the diodes (D1 and ZD1) in the path 510.

Similarly, one end of a path 520 is connected between the current sensor 502 and the inductor (L2). The other end of the path 520 is connected to one end (also referred to as the DESAT terminal) of the second gate driver (GD2). In the path 520, a diode (D2) and a Zener diode (ZD2) are connected back-to-back. Other components, such as a resistor (R2), may be connected in series with the diodes (D2 and ZD2) in the path 520.

The circuit paths 510 and 520 may operate with the inductors (L1, L2) to facilitate the DESAT threshold adjustment functions as shown in block 216 in FIG. 2.

The voltage across the inductor (L1) is represented by $V_{L1}$, the voltage across the first switch (SW1) (e.g., between the source end (S1) and the drain end (D'1) of the first switch (SW1)) is represented by $V_{SW1}$, the voltage difference between the gate end and the drain end (D'1) of the first switch (SW1) is represented by $V_{GD1}$, and the voltage across the gate driver (GD1) (or GD1 and the resistor (R1)) corresponds to a DESAT voltage ($V_{DESAT1}$). The DESAT voltage ($V_{DESAT1}$) may trip the first gate driver (GD1) when the DESAT voltage ($V_{DESAT1}$) reaches a DESAT threshold. The DESAT threshold may be adjusted with the diode (D1, $V_{D1}$=0.7V), the Zener diode (ZD1, $V_{D1} < V_{th,DESAT}$), and/or other suitable components to provide a voltage reference.

Furthermore, the DESAT threshold may be adjusted by the inductor (L1) with a small inductance. As shown in FIG. 5, the inductor (L1) is connected in series with the power switch (SW1). As the large inductive load (e.g., motors) dominates the circuit and makes this add-on inductance negligible, inductors (such as L1 and L2) may be utilized to further improve the detection performance.

The improved DESAT detection performance with the inductor (L1) is explained as follows.

A fault is detected by the DESAT function of the gate driver (GD1) of the power switch (SW1) when the DESAT terminal input $$(V_{DESAT1})$$

of the gate driver (GD1) is higher than the DESAT threshold voltage $$(V_{th,DESAT}):$$

$$V_{DESAT1}(t) \geq V_{th,DESAT}, \qquad (\text{Eq. 3})$$

where t represents the detection time. According to the conventional method, $V_{th,DESAT}$ is fixed according to a gate driver datasheet, while $$V_{DESAT1}$$

depends on the operation condition of the power switch (SW1) with an on-state resistance $$(R_{ds,on}):$$

$$V_{DESAT1}(t) = V_{ZD1} + V_{D1} + L_1 \times \frac{di_f}{dt} + R_{ds,on} \times i_f(t), \qquad (\text{Eq. 4})$$

where $$i_f(t)$$

represents the current passing through the inductor (L1) and the power switch (SW1), and $$R_{ds,on}$$

is the on-state resistance of the power switch (SW1).

For a fault current with a constant rate of rise $$\frac{di_f}{dt} = const,$$

the fault current at the moment of detection is the only variable. The detection current ($I_{detect}$) can be solved from Equation 4 as:

$$I_{detect} = i_f(t_{detect}) = \frac{1}{R_{ds,on}}\left(V_{th} - L_1 \times \frac{di_f}{dt}\right), \qquad (\text{Eq. 5})$$

where $$V_{th} = V_{DESAT1}(t_{detect}) - V_{ZD1} - V_{D1}.$$

Considering the DESAT delay between the detection moment and the trip moment, the actual trip current $$(I_{trip})$$

will be $$I_{trip} = I_{detect} + t_{delay,DESAT} \times \frac{di_f}{dt},$$

which can be expanded as:

$$I_{trip} = \frac{1}{R_{ds,on}}(V_{th}) - \frac{L_1}{R_{ds,on}} \times \frac{di_f}{dt} + t_{delay,DESAT} \times \frac{di_f}{dt}. \qquad (\text{Eq. 6})$$

In Equation 6, the effect of fault rise rate $$\frac{di_f}{dt}$$

can be eliminated by choosing an appropriate value for the add-on inductance (e.g., $$L_1$$

for the inductor L1), such as:

$$L_1 = t_{delay,DESAT} \times R_{ds,on}. \qquad (\text{Eq. 7})$$

In this way, the inductor (L1) can be utilized to mitigate the influence of fault di/dt and achieve a stable DESAT detection threshold across all fault di/dt values. This is particularly critical for motor protection in AC systems because the di/dt of AC fault current constantly changes over time.

In a similar way, the second gate driver (GD2) may be tripped based on a corresponding DESAT voltage $$(V_{DESAT2}).$$

The DESAT voltage $$(V_{DESAT2})$$

corresponds to a DESAT threshold that is adjustable by the components in the path 520, such as the diode (D2) and the Zener diode (ZD2), and the small inductor (L2).

Figure 6:
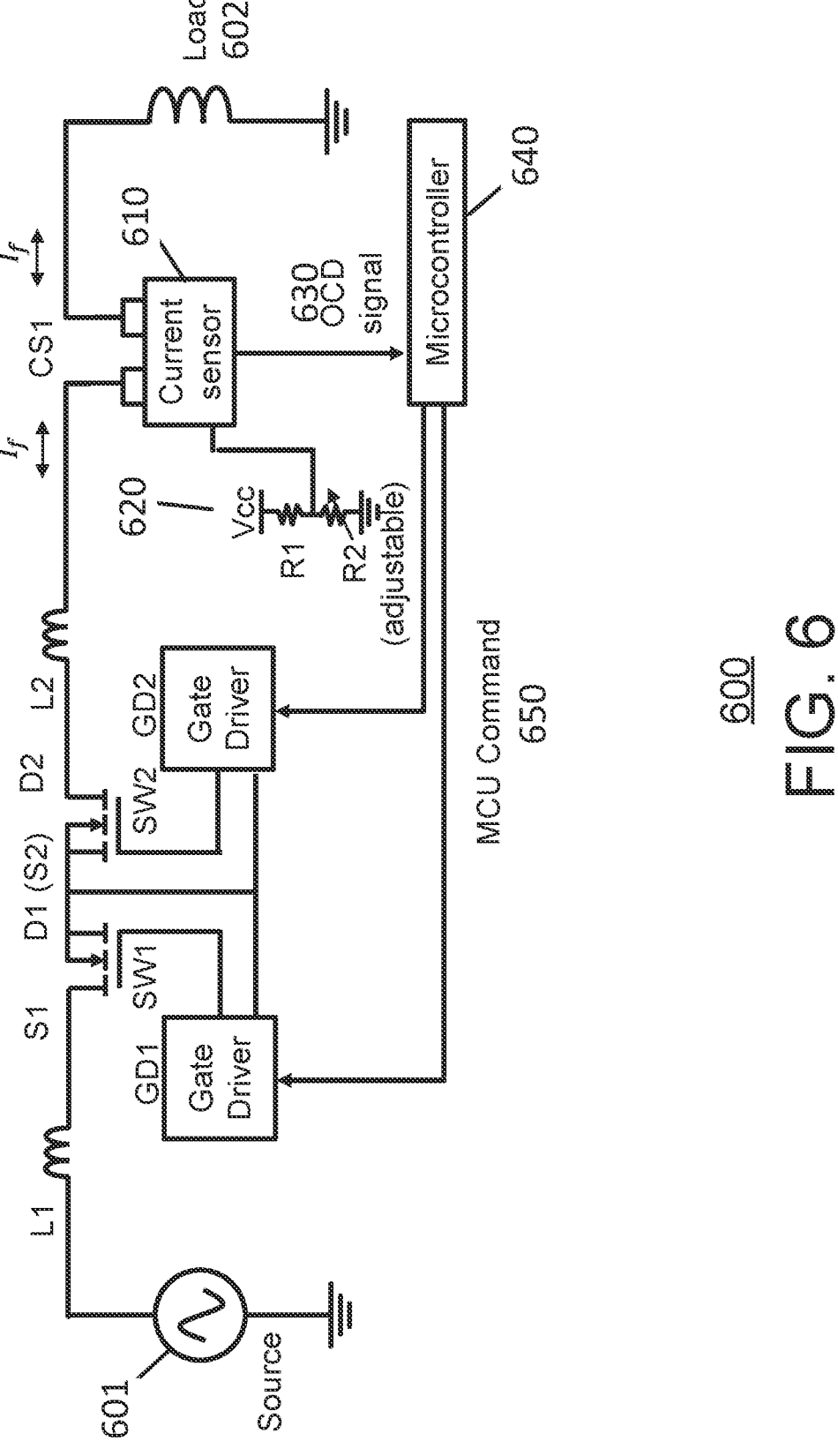
FIG. 6 is a schematic circuit illustrating an exemplary overcurrent detection (OCD) detection section according to one or more embodiments of the present disclosure.

FIG. 6 is a schematic circuit illustrating an exemplary OCD detection section according to one or more embodiments of the present disclosure. The OCD detection section 600 may be incorporated in any of the devices/circuits according to various embodiments of the present disclosure. The OCD detection section 600 may be employed to generate the OCD signal 134 as shown in FIG. 1 or the OCD signal 224 as shown in FIG. 2.

As shown in FIG. 6, the circuit includes a first power switch (SW1) and a second power switch (SW2) that are connected in series. Each switch includes a source end (denoted as S), a drain end (denoted as D) and a gate end (denoted as G). As shown in FIG. 6, the source end (S1) of the first switch (SW1) is connected to a power source 601 in series with an inductor (L1). The drain end (D1) of the first switch (SW1) is connected to the source end (S2) of the second switch (SW2). The drain end (D2) of the second switch (SW2) is connected to a current sensor 610 in series with an inductor (L2). The current sensor 610 is connected in series in the circuit path between the switches (SW1 and SW2) and a load 602. The gate end of the first switch (SW1) is connected to a first gate driver (GD1), and the gate end of the second switch (SW2) is connected to a second gate driver (GD). The drain end (D1) of the first switch (SW1) and the source end (S2) of the second switch (SW2) are both connected to the first gate driver (GD1) and connected to the second gate driver (GD2).

The power switch (SW1, SW2)) and/or the gate drivers (GD1, GD2) may be included in a power semiconductor, such as the power semiconductor 120 in FIG. 1 or the power semiconductor 204 in FIG. 2. The inductors (L1, L2) may be examples of the inductor 206 in FIG. 2. The current sensor (CS1) 610 may be an example of the current sensor 220 as shown in FIG. 2.

I One end (or terminal) of the current sensor 610 is connected to a circuit/device 620 that provides a reference to the current sensor (CS1) 610. For example, the circuit/device 620 may include a voltage divider 620, referencing the auxiliary voltage high level (Vcc) and the auxiliary voltage low level (GND). The voltage divider 620 may provide an adjustable reference (e.g., a voltage/current reference) based on a fixed resistor (R1) and an adjustable resistor (R2) in the voltage divider. The current sensor 610 may output an OCD signal 630 based on comparing the sensed current $$(e.g., I_f)$$

to a reference current (e.g., based on the reference provided by the circuit/device 620).

The circuit/device 620 may be utilized to facilitate the OCD threshold adjustment functions as shown in block 222 in FIG. 2.

In some examples, the OCD output of the current sensor 610 may go through a microcontroller 640 to be merged with another signal (e.g., a TRIP signal from an analog detection circuit). The microcontroller 640 may process the received signal(s) to issue a digital command 650. For example, if either the OCD signal 630 or a TRIP signal (not shown in FIG. 6) flags a fault, the microcontroller 640 may issue a digital command to both gate drivers (GD1, GD2) and turn off both power switches (SW1, SW2).

The microcontroller 640 may be an example of the microcontroller 140 as shown in FIG. 1 or the microcontroller 240 as shown in FIG. 2.

Figure 7:
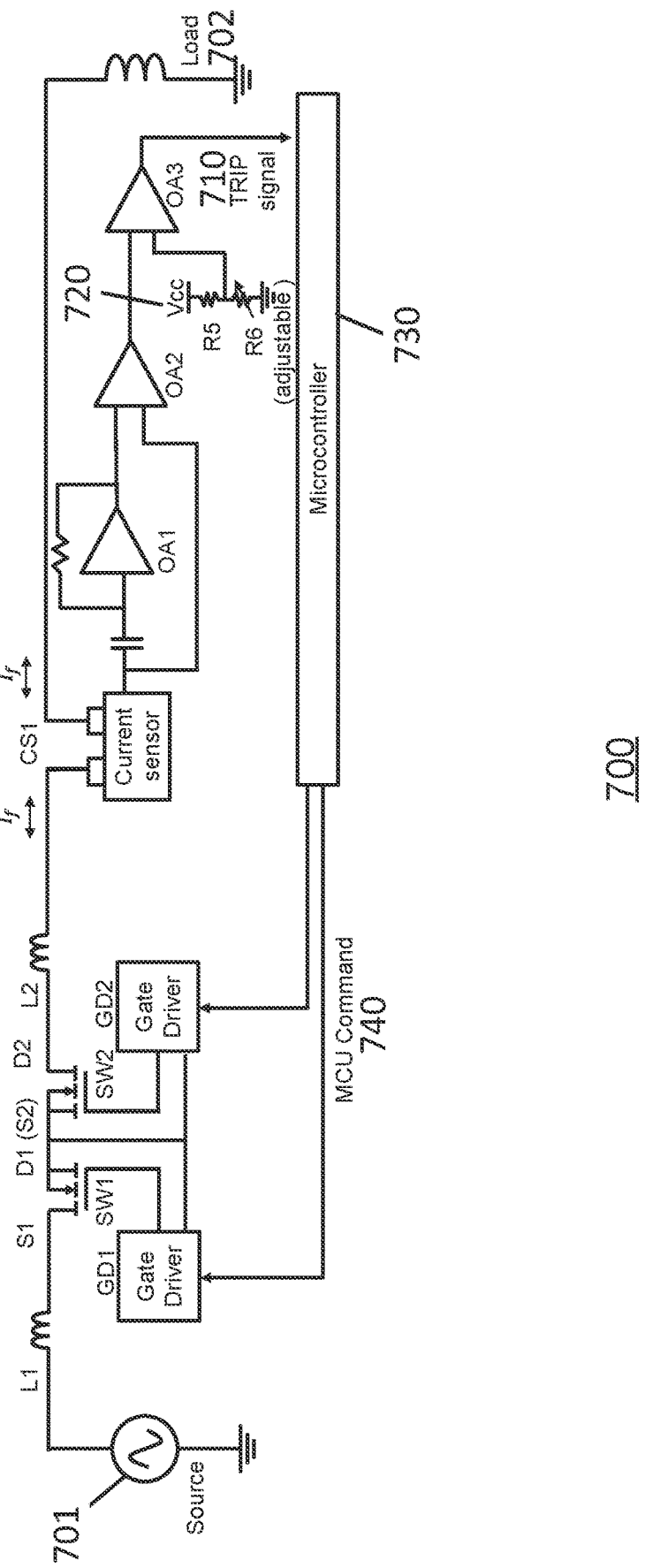
FIG. 7 is a schematic circuit illustrating an exemplary Transient Recompensed Instantaneous Trip (TRIP) section according to one or more embodiments of the present disclosure.

FIG. 7 is a schematic circuit illustrating an exemplary TRIP section according to one or more embodiments of the present disclosure. The TRIP section 700 may be incorporated in any of the devices/circuits according to various embodiments of the present disclosure. The TRIP section 700 may be employed to generate the TRIP signal 136 as shown in FIG. 1 or the TRIP signal 238 as shown in FIG. 2.

As shown in FIG. 7, the circuit includes power switches (SW1 and SW2), gate drivers (GD1 and GD2), and a current sensor (CS1) connected in a similar manner to the corresponding components in the circuit as shown in FIG. 5 and FIG. 6. Similarly, the power switches (SW1 and SW2) are connected to a power source 701 in series with an inductor (L1) and connected to the current sensor (CS1) in series with an inductor (L2). The current sensor (CS1) is connected to a load 702.

The power switch (SW1, SW2)) and/or the gate drivers (GD1, GD2) may be included in a power semiconductor, such as the power semiconductor 120 in FIG. 1 or the power semiconductor 204 in FIG. 2. The inductors (L1, L2) may be examples of the inductor 206 in FIG. 2. The current sensor (CS1) may be an example of the current sensor 220 as shown in FIG. 2.

An end (or terminal) of the current sensor (CS1) is connected to an analog detection circuit (e.g., the TRIP section 700) that utilizes op-amps (e.g., OA1, OA2, and OA3) to issue a TRIP signal 710. The TRIP section 700 may utilize the op-amps and/or other suitable hardware/software components to facilitate the functions in blocks 232, 234, and 236 as shown in FIG. 2.

The trip signal 710 may go through the microcontroller 730 to command the gate drivers (GD1 and GD2). For example, the microcontroller 730 may send a MCU command 740 to control the gate drivers (GD1 and GD2). The microcontroller 730 may be an example of the microcontroller 140 as shown in FIG. 1 or the microcontroller 240 as shown in FIG. 2.

The analog circuit 700 processes an analog current sensing output $$(K_1 I_f)$$

from the current sensor (CS1), where $$K_1$$

is a sensing ratio from primary current $I_f$ to secondary sensor output. In FIG. 7, there are three op-amps (e.g., OA1, OA2, and OA3) in the circuit. The OA1 constructs a differentiator to extract the rate of rise in the current $$\left( K_2 \frac{dI_f}{dt} \right),$$

where $K_2$ is the compensation ratio to adjust the actual trip threshold. The OA2 constructs an adder to combine the $$K_2 \frac{dI_f}{dt}$$

with the sensed current $$(K_1 I_f).$$

The OA3 constructs a comparator to check if $$K_2 \frac{dI_f}{dt} + K_1 I_f$$

exceeds a preset trip threshold $$(I_{f,th}),$$

which is adjustable by a resistive voltage divider (e.g., 720). A TRIP signal will be issued when:

$$K_2 \frac{dI_f}{dt} + K_1 I_f(t) \geq I_{f,th}. \qquad \text{(Eq. 8)}$$

In this way, the actual trip current $I_f(t)$ is dependent on the fault di/dt value. With a good selection of $K_2$ value, the influence of fault di/dt can be mitigated and a stable TRIP detection threshold can be achieved at high di/dt values.

Figure 8:
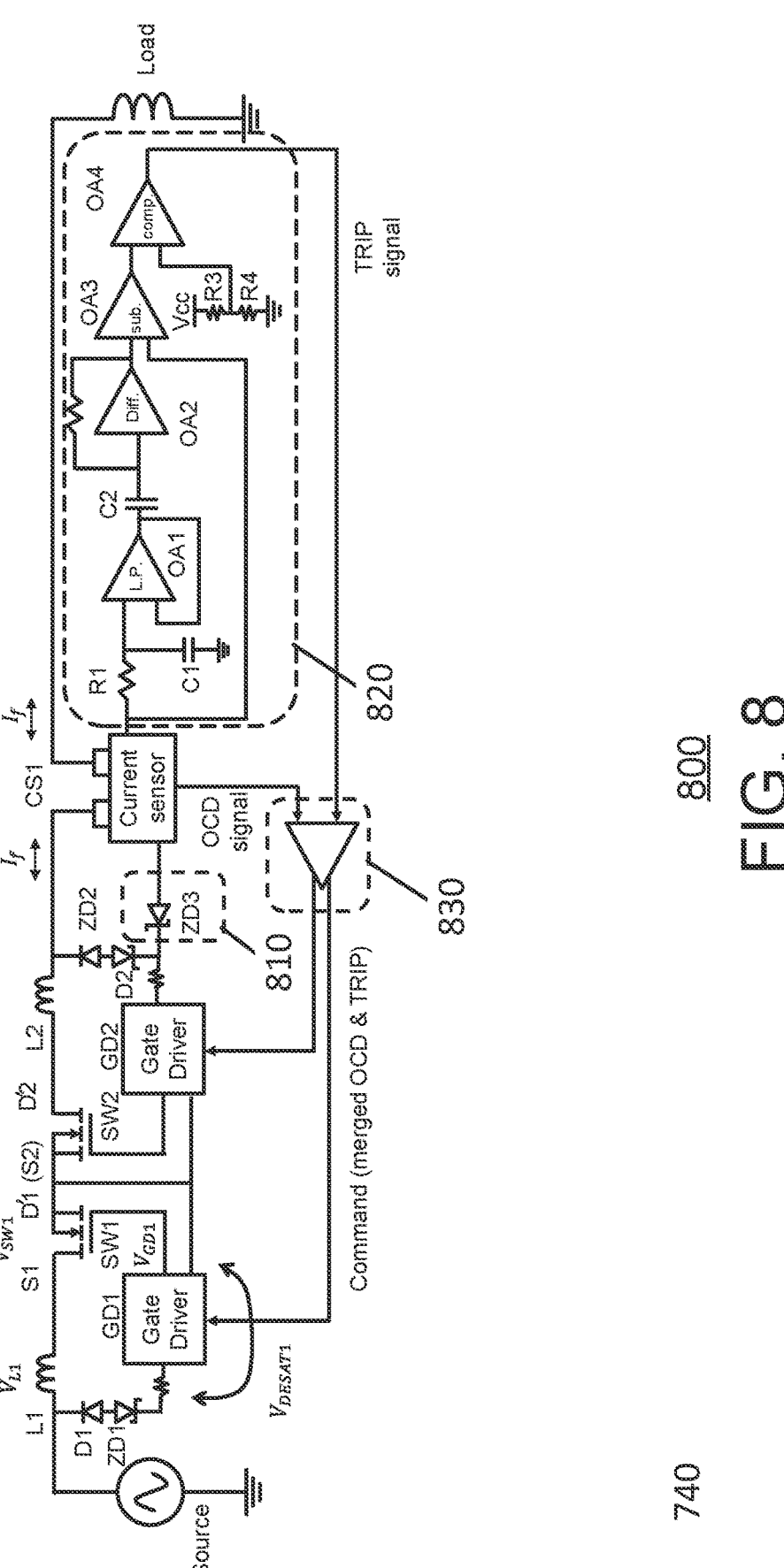
FIG. 8 is a schematic circuit illustrating exemplary modifications to the circuit according to one or more embodiments of the present disclosure.

FIG. 8 is a schematic circuit illustrating exemplary modifications to the circuit according to one or more embodiments of the present disclosure. The circuit 800 may be incorporated in any of the devices/circuits according to various embodiments of the present disclosure.

As shown in dashed block 810, a Zener diode (ZD3) may be connected between the gate driver (e.g., GD2) and the current sensor (CS1). The Zener diode (ZD3) may be utilized to mitigate the di/dt effect in the OCD detection (e.g., as shown in FIG. 6). In this arrangement, the OCD detection threshold may share the same di/dt compensation like the DESAT detection by referring to the technically small inductance (L2).

As shown in dashed block 820, the analog detection circuit may adopt a different configuration comparing to the analog detection circuit as shown in FIG. 7 (e.g., including three OAs). As shown in FIG. 8, the analog detection circuit in this configuration may include a low-pass filter (OA1), a differentiator (OA2), a subtractor (OA3), and a comparator (OA4).

As shown in dashed block 830, one or more op-amp gates (e.g., including AND or gate) may replace the microcontroller (e.g., 640 in FIGS. 6 and 730 in FIG. 7) to merge the OCD signal and the TRIP signal, and then send a command to the gate drivers (GD1 and GD2).

FIG. 9 is a flowchart of protecting a solid-state motor controller according to one or more embodiments of the present disclosure. The solid-state motor controller may include a circuit breaker device, which may be any of the devices/systems provided in the present disclosure and/or include any circuitry provided in the present disclosure. The circuit breaker device may be integrated in or connected to the solid-state motor controller. By implementing the circuit breaker device, the solid-state motor controller utilizes three protection mechanisms discussed above to facilitate fault detection and safe fault interruption.

At block 910, a gate driver (e.g., the gate driver 212 in FIG. 2, or GD1 or GD2 in FIGS. 5-8) measures semiconductor voltage after inductance adjustment. For example, in FIG. 5, the gate driver (GD1) measures the semiconductor voltage ($V_{DESAT1}$) represented by Equation 4a. As shown in Equation 4a, the inductance adjustment may be represented by the term $V_{L1}(t)$ in the equation.

At block 912, fault is detected by DESAT mechanism if measured voltage is higher than the adjusted DESAT threshold (e.g., as demonstrated in FIG. 5).

At block 920, a current sensor (e.g., 220 in FIG. 2, or CS1 in FIGS. 6-8) measures semiconductor current. For example, in FIG. 6, the current sensor (CS1) is connected in series with the power switches (SW1 and SW2). The current sensor (CS1) measures the current ($I_f$) flowing through the current sensor (CS1).

At block 922, fault is detected by OCD mechanism if measured current is higher than the adjusted OCD threshold (e.g., as demonstrated in FIG. 6).

At block 924, fault is detected by an analog TRIP circuit if filtered current signal is higher than the adjusted, di/dt-dependent threshold (e.g., as demonstrated in FIG. 7).

At block 926, MCU commands gate driver to turn off upon receiving OCD signal or TRIP signal, whichever comes earlier. In some examples, such as in the circuit breaker device 210 in FIG. 2, the microcontroller 240 generates a MCU command 242 based on the OCD signal 224 and/or the trip signal 238. For example, the microcontroller 240 may generate a MCU command 242 based on merging the OCD and TRIP signals.

At block 928, the gate driver turns off upon receiving MCU commands or DESAT signal, whichever comes earlier (e.g., as demonstrated in FIG. 2).

At block 930, the solid-state motor controller safely isolates the fault below the upper fault-handling limit of semiconductors. For example, the solid-state motor controller may achieve a combined trip curve as shown in FIG. 4 to achieve fault detection and safe fault interruption with improved performance.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. For example, the various embodiments of the kinematic, control, electrical, mounting, and user interface subsystems can be used interchangeably without departing from the scope of the invention. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A method for protecting a circuit comprising a switch device connected between a power source and a load, the switch device controlled by a gate driver, the method comprising:

generating a first trip signal indicating a desaturation (DESAT) signal based on an input voltage to the gate driver and a first trip threshold;

generating a second trip signal indicating an overcurrent detection (OCD) signal based on a current obtained by a current sensor and a second trip threshold;

generating a third trip signal indicating a transient recompensed instantaneous trip (TRIP) signal based on the current obtained by the current sensor and a third trip threshold, wherein the third trip threshold is adjustable based on a rate of rise of the current obtained by the current sensor, wherein the third trip threshold is determined based on a preset trip threshold and a threshold adjustment based on the rate of rise of the current obtained by the current sensor;

detecting, using a microcontroller, a fault based on merging at least two of the first trip signal, the second trip signal, and the third trip signal; and controlling, based on detecting the fault, the gate driver to disconnect the switch device.

2. The method of claim 1, wherein the first trip threshold is adjusted through an inductor connected in series with the switch device.

3. The method of claim 1, further comprising:

generating, by the microcontroller, based on the second trip signal and the third trip signal, an output indicating a fault, wherein detecting the fault based on merging at least two of the first trip signal, the second trip signal, and the third trip signal further comprises:

detecting the fault based on the first trip signal and the output of the microcontroller.

4. The method of claim 3, wherein detecting the fault based on merging at least two of the first trip signal, the second trip signal, and the third trip signal further comprises:

detecting the fault based on receiving an earlier signal between the first trip signal and the output of the microcontroller; and generating the output of the microcontroller based on receiving an earlier signal between the second trip signal and the third trip signal.

5. The method of claim 1, wherein the current sensor is connected in series with the switch device, or wherein the current sensor is electromagnetically coupled to a current-conducting wire connected to the switch device.

6. The method of claim 1, wherein the second trip threshold is adjustable by a voltage divider, and wherein the voltage divider comprises a fixed resistor and an adjustable resistor.

7. The method of claim 1, wherein generating the third trip signal indicating the TRIP signal based on the current obtained by the current sensor and the third trip threshold further comprises:

generating a first current element by scaling the rate of rise of the current with a first ratio;

generating a combined current based on combining the first current element and a second current element, wherein the second current element is obtained by scaling the current obtained by the current sensor with a second ratio;

comparing the combined current with the third trip threshold; and generating the third trip signal based on the combined current being greater or equal to the third trip threshold.

8. The method of claim 1, wherein generating the third trip signal indicating the TRIP signal based on the current obtained by the current sensor and the third trip threshold is performed by a plurality of operational amplifiers (op-amps), wherein the plurality of op-amps comprises a first op-amp as a differentiator, a second op-amp as an adder, and a third op-amp as a comparator.

9. The method of claim 1, wherein generating the third trip signal indicating the TRIP signal based on the current obtained by the current sensor and the third trip threshold is performed by a plurality of operational amplifiers (op-amps), wherein the plurality of op-amps comprises a first op-amp as a low-pass filter, a second op-amp as a differentiator, a third op-amp as a subtractor, and a fourth op-amp as a comparator.

10. The method of claim 1, wherein the switch device comprises one or more metal-oxide-semiconductor field-effect transistors (MOSFETs), insulated gate bipolar transistors (IGBTs), bipolar transistors, high-electron-mobility transistors, junction field-effect transistors, bipolar junction transistors, fin field-effect transistors, or gate injection transistors.

11. A device for circuit protection, comprising:

one or more switches connected between a power source and a load;

one or more gate drivers connected to the one or more switches and configured to disconnect the one or more switches based on detecting a fault, wherein the one or more gate drivers are configured to generate a first trip signal indicating a desaturation (DESAT) signal based on an input voltage to the one or more gate drivers and a first trip threshold;

a current sensor connected to a circuit path to obtain a current flowing through the one or more switches, wherein the current sensor is configured to generate a second trip signal indicating an overcurrent detection (OCD) signal based on the current obtained by the current sensor and a second trip threshold;

an analog circuit comprising a plurality of operational amplifiers (op-amps), the analog circuit connected between the current sensor and a microcontroller, wherein the analog circuit is configured to generate a third trip signal indicating a transient recompensed instantaneous trip (TRIP) signal based on the current obtained by the current sensor and a third trip threshold adjusted by a rate of change of the current obtained by the current sensor; and the microcontroller connected to the current sensor, an output end of the analog circuit, and the one or more gate drivers, wherein the microcontroller is configured to generate an output indicating a fault based on the second trip signal and the third trip signal, wherein detecting the fault is based on receiving an earlier signal between the first trip signal and the output of the microcontroller, and wherein the microcontroller is configured to generate the output of the microcontroller based on receiving an earlier signal between the second trip signal and the third trip signal.

12. The device of claim 11, further comprising:

one or more inductors connected in series with the one or more switches, wherein the first trip threshold is adjusted through the one or more inductors.

13. The device of claim 11, wherein the current sensor is connected in series with the one or more switches, or wherein the current sensor is electromagnetically coupled to a current-conducting wire connected to the one or more switches.

14. The device of claim 11, further comprising:

a voltage divider connected to the current sensor, wherein the voltage divider comprises a fixed resistor and an adjustable resistor, and wherein the second trip threshold is adjustable by the voltage divider.

15. The device of claim 14, wherein the analog circuit comprising the plurality of op-amps is configured to:

generate a first current element by scaling the rate of rise of the current with a first ratio;

generating a combined current based on combining the first current element and a second current element, wherein the second current element is obtained by scaling the current obtained by the current sensor with a second ratio;

comparing the combined current with the third trip threshold; and generating the third trip signal based on the combined current being greater or equal to the third trip threshold.

16. The device of claim 11, wherein the plurality of op-amps comprises a first op-amp as a differentiator, a second op-amp as an adder, and a third op-amp as a comparator, or wherein the plurality of op-amps comprises a first op-amp as a low-pass filter, a second op-amp as a differentiator, a third op-amp as a subtractor, and a fourth op-amp as a comparator.

17. The device of claim 11, further comprising:

a Zener diode connected between the output of a gate driver of the one or more gate drivers and the current sensor.

18. A device for circuit protection, comprising:

one or more switches connected between a power source and a load;

one or more gate drivers connected to the one or more switches and configured to disconnect the one or more switches based on detecting a fault, wherein the one or more gate drivers are configured to generate a first trip signal indicating a desaturation (DESAT) signal based on an input voltage to the one or more gate drivers and a first trip threshold;

a current sensor connected to a circuit path to obtain a current flowing through the one or more switches, wherein the current sensor is configured to generate a second trip signal indicating an overcurrent detection (OCD) signal based on the current obtained by the current sensor and a second trip threshold;

an analog circuit comprising a plurality of operational amplifiers (op-amps), the analog circuit connected between the current sensor and one or more logic gates, wherein the analog circuit is configured to generate a third trip signal indicating a transient recompensed instantaneous trip (TRIP) signal based on the current obtained by the current sensor and a third trip threshold adjusted by a rate of change of the current obtained by the current sensor; and the one or more logic gates connected to the current sensor, an output end of the analog circuit, and the one or more gate drivers, wherein the one or more logic gates are configured to generate an output indicating a fault based on the second trip signal and the third trip signal, wherein detecting the fault is based on the first trip signal and the output of the one or more logic gates, wherein the plurality of op-amps comprises a first op-amp as a differentiator, a second op-amp as an adder, and a third op-amp as a comparator, or wherein the plurality of op-amps comprises a first op-amp as a low-pass filter, a second op-amp as a differentiator, a third op-amp as a subtractor, and a fourth op-amp as a comparator.

19. The device of claim 18, wherein the current sensor is connected in series with the one or more switches, or wherein the current sensor is electromagnetically coupled to a current-conducting wire connected to the one or more switches.

20. The device of claim 18, further comprising:

a voltage divider connected to the current sensor, wherein the voltage divider comprises a fixed resistor and an adjustable resistor, and wherein the second trip threshold is adjustable by the voltage divider.

* * * * *